United States Patent
Sotgiu et al.

(10) Patent No.: US 8,039,831 B2
(45) Date of Patent: Oct. 18, 2011

(54) ELECTRONIC DEVICE CONTAINING SEMICONDUCTOR POLYMERS AND CORRESPONDING MANUFACTURING PROCESS

(76) Inventors: Riccardo Sotgiu, Varese (IT); Agostino Pirovano, Corbetta (IT)

( * ) Notice: Subject to any disclaimer, the term of this patent is extended or adjusted under 35 U.S.C. 154(b) by 1290 days.

(21) Appl. No.: 11/700,541

(22) Filed: Jan. 30, 2007

(65) Prior Publication Data
US 2007/0194393 A1 Aug. 23, 2007

(30) Foreign Application Priority Data

Jan. 30, 2006 (EP) .................................. 06425040

(51) Int. Cl.
*H01L 29/08* (2006.01)
*H01L 35/24* (2006.01)
*H01L 51/00* (2006.01)

(52) U.S. Cl. .......... 257/40; 313/504; 313/506; 257/355; 257/356; 257/200; 257/88; 257/93; 428/690; 428/917

(58) Field of Classification Search ........................ None
See application file for complete search history.

(56) References Cited

U.S. PATENT DOCUMENTS

| 5,608,287 | A | * | 3/1997 | Hung et al. ..................... | 313/503 |
|---|---|---|---|---|---|
| 5,854,139 | A | * | 12/1998 | Aratani et al. ................. | 438/780 |
| 6,190,978 | B1 | | 2/2001 | D'Anna | |
| 2001/0041270 | A1 | * | 11/2001 | Maruyama et al. ........... | 428/690 |
| 2002/0153831 | A1 | * | 10/2002 | Sakakura et al. .............. | 313/504 |
| 2003/0015960 | A1 | * | 1/2003 | Seo et al. ....................... | 313/504 |
| 2003/0020088 | A1 | * | 1/2003 | Seo et al. ....................... | 257/103 |
| 2003/0075733 | A1 | * | 4/2003 | Yamazaki et al. ............. | 257/200 |
| 2003/0227253 | A1 | * | 12/2003 | Seo et al. ....................... | 313/504 |
| 2004/0217424 | A1 | * | 11/2004 | Shih ................................ | 257/355 |
| 2005/0261459 | A1 | * | 11/2005 | Marrocco et al. ............. | 528/125 |

FOREIGN PATENT DOCUMENTS
EP 0729191 A2 8/1996

OTHER PUBLICATIONS

European Search Report, EP06425040, Aug. 28, 2006.
Lynch, W.T., et al., A Tester for the Contact Resistivity of Self-Aligned Silicides, IEEE Transactions on Semiconductor Manufacturing, XP010070792, pp. 352-355, Dec. 11, 1998.
Kaminorz, Yvette, et al., Characteristics of Polythiophene Surface light Emitting Diodes, Synthetic Metals, vol. 113, No. 1/2, XP000961515, pp. 103-114, Jun. 15, 2000.
Smela, Elisabeth, et al., Planar Microfabricated Polymer Light-Emitting Diodes, Semiconductor Science and Technology, vol. 13, No. 4, XP000739997, pp. 433-439, Apr. 1998.
Yan, Jun, et al., Sensor for Monitoring the Rinsing of Patterned Wafers, IEEE Transactions on Semiconductor Manufacturing, vol. 17, No. 4, XP001209973, pp. 531-537, Nov. 2004.

* cited by examiner

*Primary Examiner* — Ha Tran T Nguyen
*Assistant Examiner* — Shantanu C Pathak
(74) *Attorney, Agent, or Firm* — Wells St. John P.S.

(57) ABSTRACT

Described herein is an electronic device provided with an electrode and a region of polymeric material set in contact with the electrode. The electrode has a polysilicon region and a silicide region, which coats the polysilicon region and is arranged, as interface, between the polysilicon region and the region of polymeric material. The polysilicon region is doped with a doping level that is a function of a desired work function at the interface with the region of polymeric material. The electronic device is, for example, a testing device for characterizing the properties of the polymeric material.

20 Claims, 3 Drawing Sheets

ELECTRONIC DEVICE CONTAINING SEMICONDUCTOR POLYMERS AND CORRESPONDING MANUFACTURING PROCESS

PRIORITY CLAIM

This application claims priority from European Patent Application No. 06425040.0, filed Jan. 30, 2006, which is incorporated herein by reference.

TECHNICAL FIELD

The present invention relates to an electronic device containing semiconductor polymers and to a corresponding manufacturing process.

BACKGROUND

As is known, it is a common conviction that the growing demands for increase in the capacity of integration and of consequent reduction in the dimensions of integrated circuits cannot be met by traditional CMOS technology and by the use of traditional semiconductor materials. In particular, scaling-down of integrated circuits to nanometric dimensions is bound to reach fundamental physical limits that will prevent the circuits from functioning in a reliable way and at the same time will entail an exponential increase in production costs. With the increase in the density of electronic devices on a single chip, phenomena such as the need to dissipate the heat generated and the transition from classic behavior to quantum behavior of the charge carriers is bound to slow down technological progress considerably.

The need to solve these problems has pushed research to study new technologies based on the use of organic materials that can replace, either altogether or in part, silicon (or similar inorganic semiconductor materials) in the manufacture of electronic devices. Molecular electronics offers indeed the potential for exceeding the limits of silicon technology, thanks to better performance and the economic advantages linked to the ready availability of the raw material and the low production costs.

In particular, it has recently been proposed to use polymers with semiconductor properties in electronic devices, such as LEDs (the so-called OLEDs—Organic Light-Emitting Diodes), field-effect transistors (the so-called OFETs—Organic Field-Effect Transistors), or polymeric memories. In detail, in these devices a region of an appropriate polymeric material is set in contact with electrodes and acts as an active region, designed, for example, for the emission of light radiation as a result of the passage of a current between the electrodes, or as a channel for modulating the current flowing between the electrodes, or as a storage element as a result of the injection of charges. In particular, to provide storage elements, polymeric materials are used having the characteristic of switching between a fundamental high-resistance state and a low-resistance state (so-called "resistive switching").

The use of semiconductor polymers leads, however, to some problems of integration in commonly employed CMOS production processes, and particular care is necessary in the fabrication of electrodes that contact the polymeric material, in order to optimize the stability and the electrical characteristics of such contact.

The materials commonly used for contacting the polymeric material are metallic materials, such as aluminium, gold, and indium, which are selected on the basis of their electrical characteristics (in particular, the work function and hence the property of charge injection in the polymeric material) required for the contact. It is known, for example, that inert materials, such as gold, are used for the injection of holes, whereas reactive materials, such as aluminium, are used for the injection of electrons within the polymeric material. However, electrodes made of the above materials suffer from certain problems, amongst which stability in atmosphere during the process of deposition of the polymeric material (which does not envisage preventive steps of cleaning of the surface of deposition), the lack of regulation of the properties of the contact, the possibility of interdiffusion of the metallic material, or problems linked to production costs in the case where materials are used that have a high cost and/or are difficult to acquire (such as gold).

Furthermore, given the continuous evolution of research and the consequent identification of new polymeric materials, the need is certainly felt to have structures for electrical testing that will allow an efficient and inexpensive way of characterizing the electrical properties of the polymers and of the corresponding contacts. In this regard, the use of metallic materials is binding for manufacturing choices, and in particular does not allow easy modification of the characteristics and work function of the contacts.

SUMMARY

Electronic devices containing semiconductor polymers enable at least some of the aforesaid disadvantages and problems to be overcome. In particular such devices may be compatible with standard CMOS processes and optimized as regards the electrical contact between the polymeric material and the corresponding electrodes.

BRIEF DESCRIPTION OF FIGURES

For a better understanding of the present invention, preferred embodiments thereof are now described, purely by way of non-limiting example and with reference to the attached drawings, wherein.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

An embodiment of the present invention envisages using, in an electronic device, a silicide region (or possibly salicide, i.e., silicide obtained with a self-aligned formation process) as a contact surface with a region of semiconductor polymeric material (acting as an active region of the electronic device). Silicides are in fact particularly stable in atmosphere, as well as having structural stability, and consequently enable a reduction of the problems linked to the deposition of the region of semiconductor polymeric material. In particular, the silicide region is formed on a polysilicon region, thus forming an electrode in contact with the polymeric material. Advantageously, the polysilicon region can be appropriately doped so as to modulate the work function of the material at the interface with the polymeric material, and hence the properties of charge injection in the polymeric material.

Figure 1:
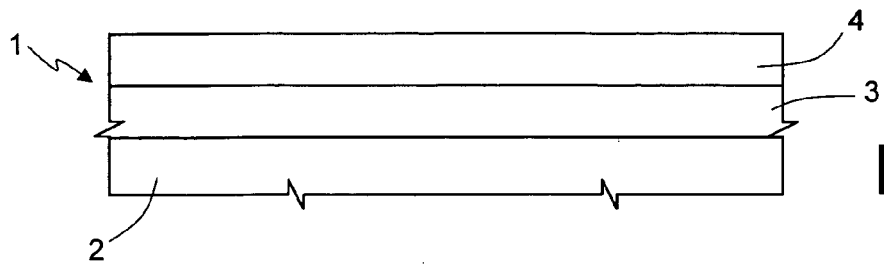
FIG. 1 is a cross-sectional view through a wafer of semiconductor material in an initial step of a process for manufacturing an electronic device containing semiconductor polymeric material, according to a first embodiment of the present invention.

With reference first to FIG. 1, a first embodiment of the present invention is now described, envisaging the formation of an electronic testing device of a vertical type, for the characterization of semiconductor polymeric material, within a wafer 1 of semiconductor material comprising a substrate 2, for example made of silicon.

In detail, in a first step of a corresponding production process, a polysilicon layer 3 is formed above the substrate 2. As will be described in detail hereinafter, the polysilicon layer 3 will form a first electrode in contact with a region of semiconductor polymeric material. The polysilicon layer 3 can then be doped, through a process of ion implantation, so as to determine the work function at the polysilicon-polymer interface. Alternatively, a polysilicon layer 3, which has already been appropriately doped, can be deposited above the substrate 2.

Next, the polysilicon layer 3 is subjected to a silicidation process (preferably a self-aligned process of salicidation), for the formation of a silicide layer 4 on the polysilicon layer 3. According to an embodiment of the present invention, the suicide layer 4 is used to passivate the surface of the polysilicon layer 3 and increase its stability in atmosphere, in order to prevent oxidation thereof during subsequent steps of deposition (in particular, as will be described hereinafter, of a region of semiconductor polymeric material). In a per se known manner, the process of salicidation initially envisages the deposition of a conductive layer of a metal, such as, for example, titanium, cobalt or nickel, above the wafer 1. Then, the wafer 1 is heated, and the metal reacts in a selective way with the underlying polysilicon layer 3 to form regions of titanium silicide, cobalt silicide, or nickel silicide, whereas it does not bind to other materials possibly present on the wafer. The metal that has not reacted is then removed, whilst the silicide regions remain intact. In practice, only the exposed polysilicon regions are silicided during the silicidation step (and the process is consequently self-aligned with respect to the polysilicon regions).

Figure 2:
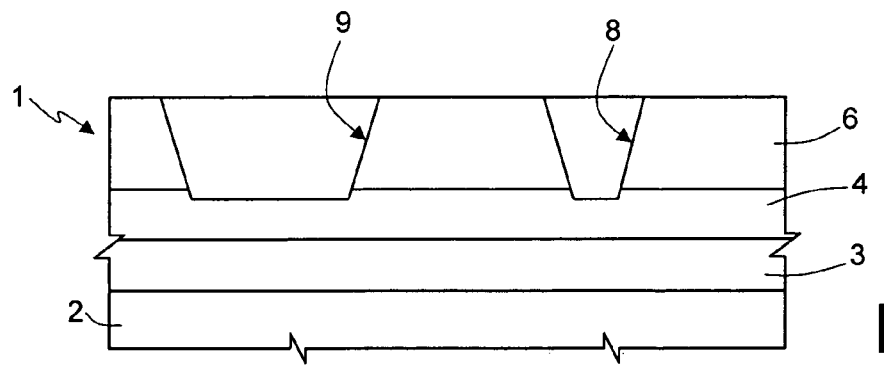
FIGS. 2-4 are cross-sectional views of the wafer of FIG. 1, in subsequent steps of the manufacturing process.

Next (FIG. 2), a dielectric layer 6, for example made of silicon nitride, is formed by deposition on the silicide layer 4. Then, using an etching mask, the dielectric layer 6 is anisotropically etched to define a first opening 8, which is meant for the formation of an active area of polymeric material, and a second opening 9, laterally with respect to the first opening 8, which is meant for the formation of a circular electrical contact region (of a plug type) for the underlying polysilicon layer 4. In particular, both the first and the second openings 8, 9 traverse the entire dielectric layer 6 and reach the underlying polysilicon layer 4, having a respective bottom surface in contact with the polysilicon layer 4.

Figure 3:
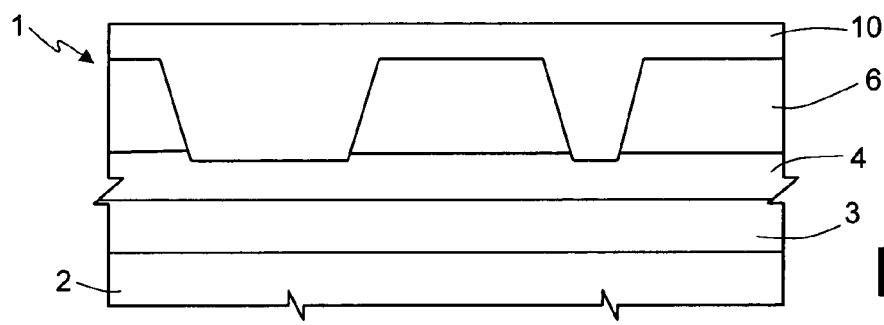

Next (FIG. 3), a layer of polymeric material 10, for example fluorescine or rose bengal, with a thickness of, for example, 100 nm, is deposited above the wafer 1. In particular, the layer of polymeric material 10 fills the first and second openings 8, 9 completely and coats the entire wafer 1.

Figure 4:
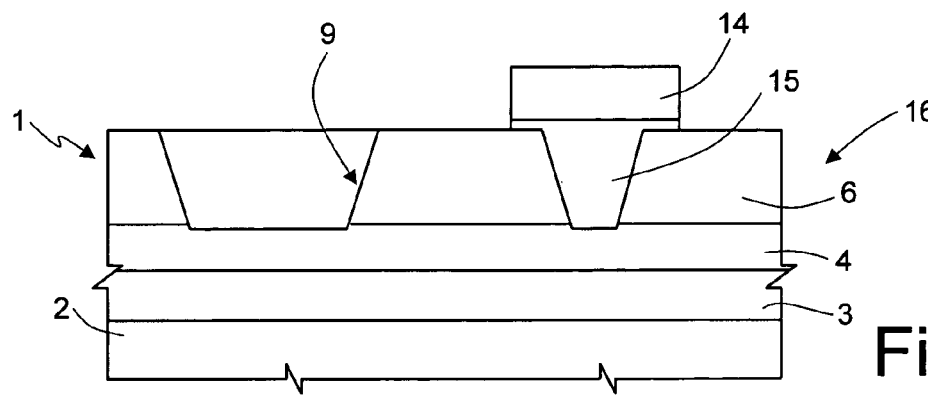
Figure 5:
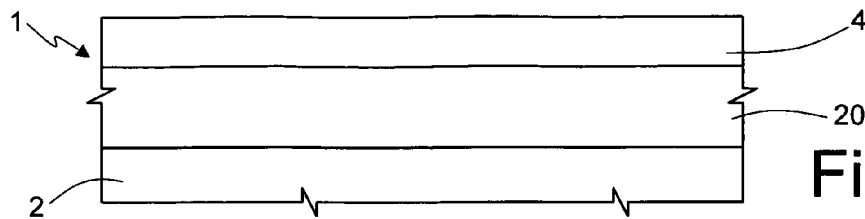
FIG. 5 is a cross-sectional view through a wafer of semiconductor material in an initial step of a process for manufacturing an electronic device containing semiconductor polymeric material, according to a second embodiment of the present invention.
Figure 6:
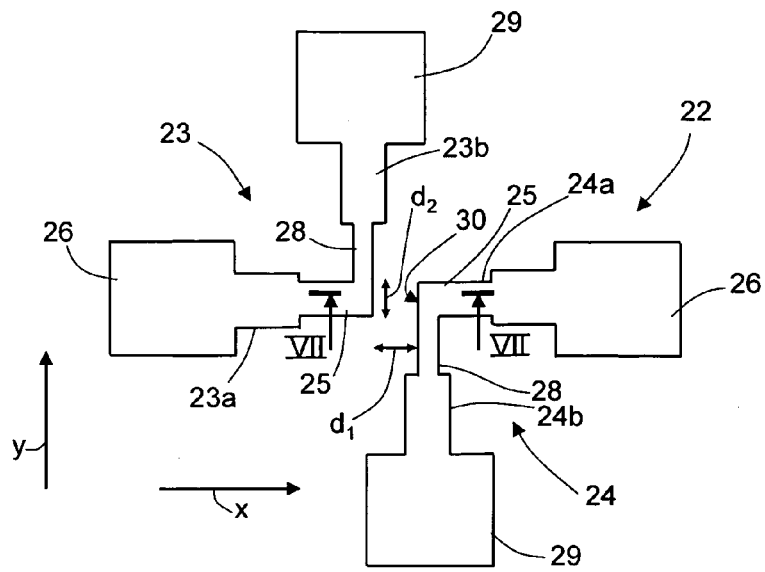
FIG. 6 shows a simplified top plan view of the wafer of FIG. 5, in a subsequent step of the manufacturing process.
Figure 7:
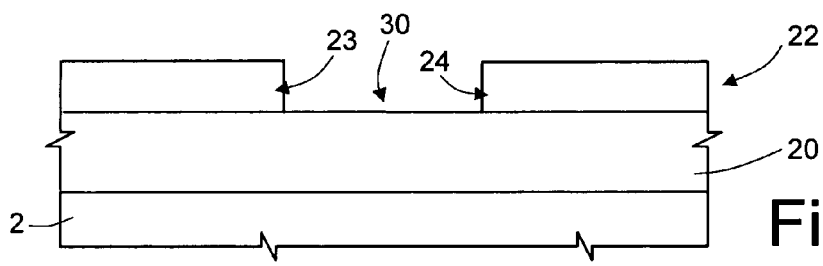
FIG. 7 is a cross-sectional view of the wafer of FIG. 6 taken along the line VII-VII.
Figure 8:
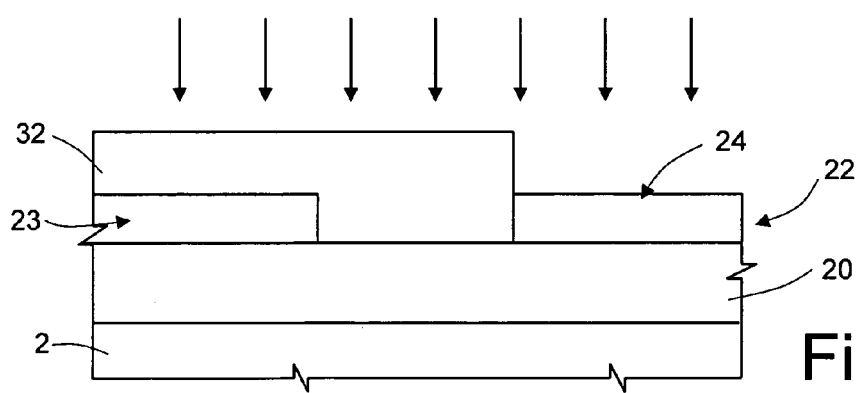
FIGS. 8-10 are cross-sectional views similar to that of FIG. 7, regarding subsequent steps of the manufacturing process.
Figure 9:
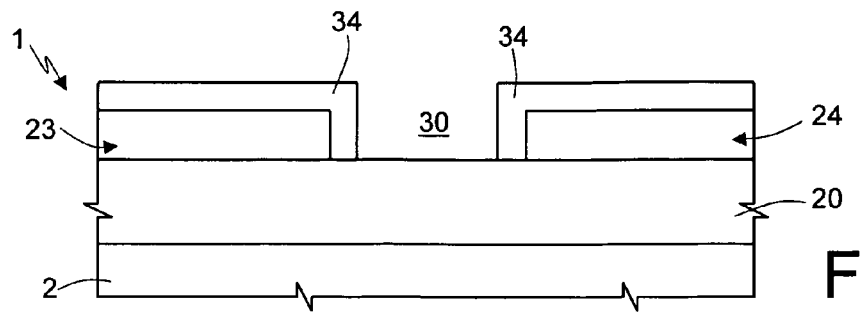
Figure 10:
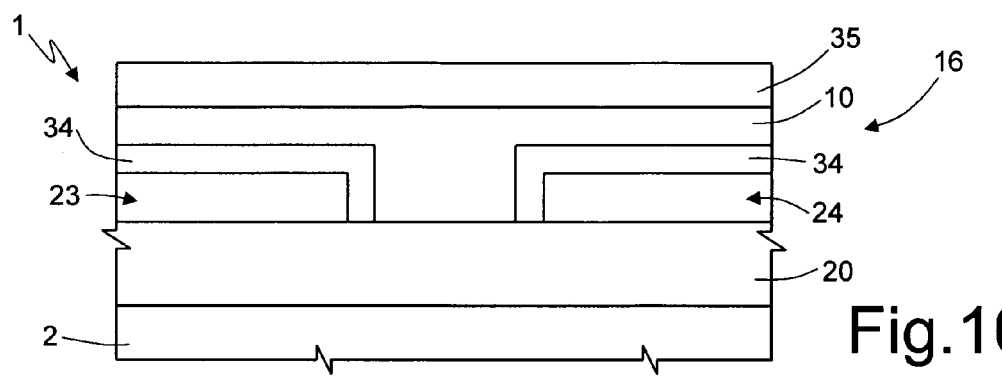

Next (FIG. 4), a metal layer, for example, aluminium, is formed (for example, by evaporation) on the layer of polymeric material 10. It may be noted that the formation of the metal layer is of a standard level-one type, and consequently does not call for particular techniques, such as the Damascene technique. The layer of polymeric material 10 and the metal layer are then etched so as to be removed except in an area corresponding to the first opening 8, thus defining a metal region 14 above the first opening 8, and an active region 15 of polymeric material, extending within the first opening 8 and between the same first opening 8 and the metal region 14. The remaining portions of the layer of polymeric material 10 are instead removed (possibly also with a subsequent cleaning operation) from the second opening 9 and from the surface of the wafer 1. In a way not shown, within the second opening 9 an electrical contact for the polysilicon layer 4 (first electrode) is then formed, for example as a tungsten plug, thus arriving at the definition of an electronic testing device 16.

Basically, the active region 15 of polymeric material constitutes an active area arranged between, and in contact with, a bottom electrode (constituted by the silicide layer 4 and by the underlying polysilicon layer 3), and a top electrode (constituted by the metal region 14) of the testing device thus obtained. In use, the first and second electrodes are used for injecting charges into the active region 15 and for electrically characterizing the polymeric material (in a per-se known manner which is not described in detail herein).

A second embodiment of the present invention, illustrated in FIGS. 5-10 (in which parts that are similar to others described previously are designated by the same reference numbers), envisages the formation of a testing device of a horizontal or planar type, in particular of the Kelvin-resistor type, for the purpose of characterizing the electrical properties of the polymeric material.

In detail (FIG. 5), first an oxide layer 20 is formed on the substrate 2, and then the polysilicon layer 4 is formed on the oxide layer 20.

Next (FIGS. 6-7), the polysilicon layer 4 is defined using an appropriate etching mask, so as to obtain a Kelvin structure 22. In detail, the Kelvin structure 22 comprises a first electrode 23 and a second electrode 24, each of which is formed by a respective pair of arms, arranged to form a right angle. In detail, a respective first arm 23a, 24a of the first and second electrodes 23, 24 extends in a first direction x and has a respective facing portion 25 and a contact end portion 26. A respective second arm 23b, 24b of the first and second electrodes 23, 24 extends in a second direction y, orthogonal to the first direction x, and has a respective attachment portion 28, connected to the corresponding facing portion 25, and a respective contact end portion 29. In particular, the facing portions 25 of the two arms face one another, are separated in the first direction x by a distance $d_1$ of, for example, 100 nm, and have a facing dimension $d_2$ in the second direction y, comprised, for example, between 100 and 400 nm. The area between the facing portions 25 of the two arms constitutes an active channel region 30, which, in a known way, is configured for passage of a test current during the electrical characterization process.

Next (FIG. 8), the remaining portions of the polysilicon layer 4 are doped using an appropriate implant mask 32 so as to obtain a differential doping of the Kelvin structure 22. For example, the implant mask 32 can cover the first electrode 23 and leave exposed the second electrode 24 of the Kelvin structure 22 so as to generate doping levels, and hence work functions, that are different for the two elements, and asymmetrical contacts with a polymeric region that will then be formed within the active channel region 30.

Next (FIG. 9), the polysilicon Kelvin structure 22 undergoes a process of silicidation so as to form silicide regions 34 on the first and second electrodes 23, 24. Preferably, a self-aligned process of silicidation is performed so as to prevent the formation of residue in the active channel region 30. As described previously, the silicide regions 34 enable passivation of the surface of the underlying polysilicon regions and, in particular, prevention of oxidation thereof in atmosphere.

Next (FIG. 10), the layer of polymeric material 10 is deposited above the wafer 1 so as to coat the silicide regions 34 and fill the active channel region 30. In addition, a capping layer 35 can be formed on the layer of polymeric material 10 so as to prevent oxidation thereof and contamination in atmosphere, thus defining the electronic testing device 16. Alternatively, the thickness of the layer of polymeric material 10 can be chosen sufficiently large so that any possible atmospheric contamination will be unable to diffuse as far as the active region of the device, but will remain confined to a surface portion of the layer of polymeric material.

In use, a test voltage is applied between the contact end portions 29 of the second arm 23b, 24b of the first and second electrodes 23, 24, respectively, and a corresponding test current, due to the injection of charges into the polymeric material within the active channel region 30, is detected between the contact end portions 26 of the first arm 23a, 24a of the first and second electrodes 23, 24, respectively.

Figure 11:
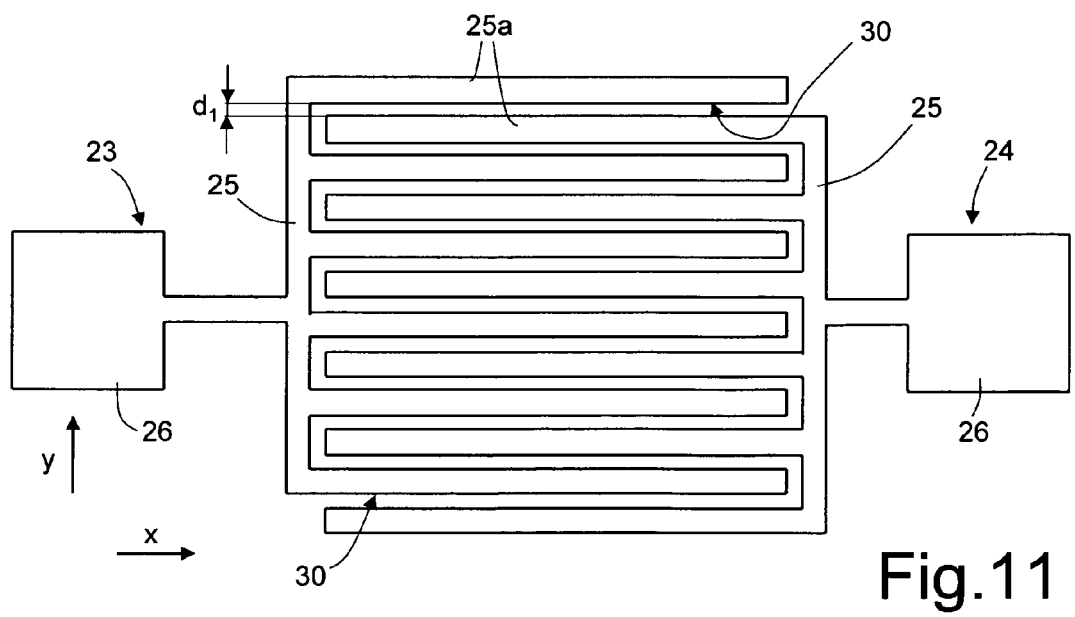
FIG. 11 shows a view similar to that of FIG. 6 according to another embodiment of the invention.

A further horizontal testing structure is illustrated in FIG. 11, in which parts that are similar are identified by the same reference numbers. In detail, the first and second electrodes 23, 24 of the testing structure comprise in this case contact end portions 26 and facing portions 25, which are comb-shaped and interdigitated so as to considerably increase the active channel region 30 that is configured for the passage of the testing electric current. In fact, the active area is constituted in this case substantially by the entire perimeter of fingers 25a of the comb-shaped facing portions, which are set at a distance apart from one another in the second direction y by a distance $d_1$, which may again be equal to 100 nm.

The advantages of the device and of the corresponding manufacturing process described are clear from the foregoing description.

In any case, it is emphasized that silicide enables passivation of the surface of polysilicon electrodes so as to prevent any alteration of the corresponding electrical properties during the step of polymeric deposition in atmosphere. The silicide region moreover has a higher structural stability than metal materials, and is less subject to interdiffusion problems.

Furthermore, the possibility of differential doping of the polysilicon electrodes enables modulation, as desired, of the work function and hence of the characteristics of injection of charge in the polymeric material. In other words, to vary the work function (for example, to carry out characterization of materials having different characteristics) it is sufficient to dope the polysilicon electrodes in a different way, without it being necessary to use different materials or modify the manufacturing process. Furthermore, as described for the Kelvin structure, it is possible to obtain contacts that are asymmetrical with respect to the region of polymeric material and to evaluate the effect of said asymmetrical contacts on the electrical characteristics of the resulting device.

The horizontal testing structure described above enables a measurement to be carried out that is not affected by the deposition of a metal layer. On the other hand, the vertical testing structure enables dimensions of the active area of polymeric material to be achieved that are extremely small, unlike the horizontal one, which is limited in this regard by the limits of the lithographic technology used for definition of the polysilicon layer and of the active channel region. In both cases, only two photolithographic processes are necessary: in the first embodiment, a first process to define the active area of polymeric material within the dielectric layer 6, and a second process to define the metal region 14; in the second embodiment, a first process to define the polysilicon layer 4 (and the structure of the electrodes) and the active channel region 30, and a second process for differential doping of the electrodes.

The polymeric material can be deposited just prior to a PMD (Pre-Metal Dielectric) deposition, which enables use of a cold process.

Finally, it is clear that modifications and variations can be made to what is described and illustrated herein, without thereby departing from the scope of the present invention, as defined in the annexed claims.

In particular, it is evident that what has been described can be advantageously applied to all electronic devices comprising a polymeric material (hence it is not limited to testing structures), for example, for the formation of organic LEDs or displays, in which the region of polymeric material is exploited for the emission of light; or else for the formation of polymeric memories, in which the region of polymeric material is used for the storage of information (exploiting the aforementioned resistive switching).

Furthermore, a wide range of other polymeric materials can be used (in particular, ones having a stable fundamental state at high resistivity), or possibly polymer/metal/polymer compounds, for example, of the $Alq_3/Ag/Alq_3$ type. The horizontal structures described can be used with all polymeric materials having bulk-memory properties, for which, that is, only the thickness deposited and not its orientation is important. The vertical structures can instead be used also with materials that require a given alignment with the electrodes.

Finally, in a way not illustrated herein, the polysilicon layer 4 in the second embodiment could be defined so as to form further structures, for example, of the "cross-point" type (which are known and hence not described in detail herein).

The invention claimed is:

1. An apparatus comprising:
   a first electrode and a region of polymeric material in contact with the first electrode, wherein the first electrode comprises a first silicide region in direct contact with the region of polymeric material; and
   a second electrode in contact with the region of polymeric material, the region of polymeric material being arranged between the first electrode and the second electrode and forming an active area of an electronic device;
   wherein the second electrode further comprises a second silicide region in contact with the region of polymeric material;
   wherein the first electrode and the second electrode comprise a first poly-silicon region and a second polysilicon region, respectively;
   wherein the first and said second silicide regions coat, respectively, the first and second polysilicon regions and are arranged, as an interface, between the first and second polysilicon regions and the region of polymeric material; and wherein the first and second polysilicon regions have different doping levels and different work functions.

2. The apparatus of claim 1, wherein the region of polymeric material is between, and coats, the first and second silicide regions, and wherein the first and second polysilicon regions face one another and are arranged at a same level over a dielectric region overlying a substrate.

3. The apparatus of claim 2, wherein the first electrode further comprises a first polysilicon region, the first silicide region coating the first polysilicon region and being arranged, as an interface, between the first polysilicon region and the region of polymeric material.

4. The apparatus of claim 3, wherein the first polysilicon region has a doping level that is a function of a desired work function at the interface with the region of polymeric material.

5. The apparatus of claim 2, further comprising an insulation region arranged on the first silicide region and surrounding and being traversed by the region of polymeric material, wherein the second electrode comprises a region of metallic material on the region of polymeric material.

6. The apparatus of claim 5, further comprising a contact element associated with the first electrode and disposed through the insulation region laterally with respect to the region of polymeric material.

7. The apparatus of claim 2, wherein the first electrode and the second electrode are arranged to form a Kelvin testing structure.

8. The apparatus of claim 2, wherein the first electrode and the second electrode are arranged to form a comb-shaped interdigitated testing structure.

9. The apparatus of claim 2, wherein the region of polymeric material comprises a semiconductor polymeric material selected from the group consisting of fluorescine, rose bengal, and $Alq_3/Ag/Alq_3$.

10. The apparatus of claim 1, further comprising electronic circuitry coupled to the active area of the electronic device to perform a desired function.

11. The apparatus of claim 10, wherein the electronic circuitry comprises memory circuitry and the region of polymeric material functions as a memory element.

12. The apparatus of claim 10, wherein the electronic circuitry comprises display circuitry and the region of polymeric material functions as an organic light emitting diode.

13. A method for manufacturing an electronic device, comprising:
forming a first electrode comprising a first polysilicon region and a first silicide region coating the first polysilicon region;
forming a region of polymeric material in contact with the first electrode, wherein the region of polymeric material is formed directly in contact with the first silicide region; and
forming a second electrode, wherein the region of polymeric material is formed between the first electrode and the second electrode, and forms an active area of the electronic device;
wherein the forming of the second electrode comprises forming a second polysilicon region and a second silicide region on the second polysilicon region, and wherein the forming of the first electrode and the forming of the second electrode are performed simultaneously and include:
forming a polysilicon layer on top of a layer of dielectric material;
etching the polysilicon layer to define the first polysilicon region and the second polysilicon region, the first and second polysilicon regions being separated by a channel region; and
forming on, and self-aligned with respect to, the first and second polysilicon regions a first silicide region and a second silicide region; and
wherein the forming of the first electrode and the forming of the second electrode further include doping with different doping levels the first and second polysilicon regions prior to the forming of the first and second silicide regions.

14. The method of claim 13, wherein the first silicide region coats the first polysilicon region and is arranged, as an interface, between the first polysilicon region and the region of polymeric material.

15. The method of claim 13, further comprising doping the first polysilicon region with a doping level that is a function of a desired work function at the interface with the region of polymeric material.

16. The method of claim 13, further comprising:
forming an insulation layer on the first silicide region;
wherein the forming of the region of polymeric material comprises:
forming a first opening through the insulation layer;
depositing a layer of polymeric material on the insulation layer and within the first opening; and
etching the layer of polymeric material except in an area corresponding to the first opening;
wherein the forming of the second electrode comprises forming a region of metallic material on the region of polymeric material.

17. The method of claim 16, further comprising:
forming a second opening through the insulation layer for a contact element for the first electrode, simultaneously with, and laterally with respect to, the first opening.

18. The method of claim 13, wherein the forming of the region of polymeric material comprises depositing a layer of polymeric material over the first and second silicide regions and within the channel region.

19. The method of claim 13, wherein the etching of the polysilicon layer to define the first and second poly-silicon regions comprises defining a Kelvin testing structure.

20. The method of claim 13, wherein the etching of the polysilicon layer to define the first and second poly-silicon regions comprises defining a comb-shaped interdigitated testing structure.

* * * * *